United States Patent
Kohr et al.

(10) Patent No.: US 12,058,831 B2
(45) Date of Patent: Aug. 6, 2024

(54) COMBINED POWER ELECTRONICS FOR AN ELECTRIC DRIVE AND A TRANSMISSION CONTROL OF THE ELECTRIC DRIVE, INVERTER WITH SUCH COMBINED POWER ELECTRONICS, ELECTRIC DRIVE WITH SUCH AN INVERTER

(71) Applicant: ZF Friedrichshafen AG, Friedrichshafen (DE)

(72) Inventors: Michael Kohr, Bodnegg (DE); Maxim Pereverzev, Ravensburg (DE); Wolfgang Scherm, Friedrichshafen (DE); Marco Igel, Bodnegg (DE); Pengshuai Wang, Friedrichshafen (DE); Roman Huff, Ravensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 317 days.

(21) Appl. No.: 17/512,962

(22) Filed: Oct. 28, 2021

(65) Prior Publication Data
US 2022/0140724 A1    May 5, 2022

(30) Foreign Application Priority Data
Oct. 29, 2020   (DE) .......................... 102020213627.0

(51) Int. Cl.
*H05K 7/14*    (2006.01)
*B60L 15/00*   (2006.01)
(Continued)

(52) U.S. Cl.
CPC .......... *H05K 7/1432* (2013.01); *B60L 15/007* (2013.01); *H01L 25/0655* (2013.01); *H02M 7/003* (2013.01)

(58) Field of Classification Search
CPC .............. H05K 7/1432; H05K 7/20927; B60L 15/007; H01L 25/0655; H02M 7/003; H02M 7/5395; H02P 27/08
(Continued)

(56) References Cited

U.S. PATENT DOCUMENTS 6,078,155 A * 6/2000 Tominaga ............ H05K 7/1432
                                                            361/717
7,352,143 B2 * 4/2008 Inaba ............... H03K 19/00376
                                                            318/139
(Continued)

FOREIGN PATENT DOCUMENTS

DE   10 2008 002 160 A1   12/2009
DE   10 2014 100 290 A1    7/2014
DE   10 2013 011 372 A1    1/2015

OTHER PUBLICATIONS

Office Action dated Jul. 6, 2021 for German Patent Application No. 10 2020 213 627.0, (14 pp.), note: pp. 1 and 2 are English language Explanations to Section C. Result of Determination Document.

*Primary Examiner* — David Luo
(74) *Attorney, Agent, or Firm* — Crowell & Moring LLP

(57) ABSTRACT

A power module for an electric axle drive may include a plurality of semiconductor switching elements, where the semiconductor switching elements are attached to a substrate. The power module may also include a control unit electrically connected to the plurality of semiconductor switching elements, where the plurality of semiconductor switching elements includes a first set of semiconductor switching elements dedicated to the electric axle drive. The plurality of semiconductor switching elements may also include a second set of second set of semiconductor switching elements dedicated to a transmission connected to the electric axle drive.

20 Claims, 3 Drawing Sheets

(51) Int. Cl.
*H01L 25/065* (2023.01)
*H02M 7/00* (2006.01)

(58) Field of Classification Search
USPC ...................... 318/139, 400.26, 400.01, 700
See application file for complete search history.

(56) References Cited

U.S. PATENT DOCUMENTS

| | | | |
|---|---|---|---|
| 7,999,503 B2* | 8/2011 | Kowalewski | H02P 27/04 318/807 |
| 9,849,791 B2* | 12/2017 | Suzuki | B60L 1/003 |
| 11,070,158 B2* | 7/2021 | Oiwa | B62D 5/0481 |
| 2010/0025126 A1 | 2/2010 | Nakatsu et al. | |
| 2016/0185232 A1 | 6/2016 | Suzuki et al. | |

* cited by examiner

COMBINED POWER ELECTRONICS FOR AN ELECTRIC DRIVE AND A TRANSMISSION CONTROL OF THE ELECTRIC DRIVE, INVERTER WITH SUCH COMBINED POWER ELECTRONICS, ELECTRIC DRIVE WITH SUCH AN INVERTER

RELATED APPLICATION

This application claims the benefit of, and priority to, German Patent Application DE 10 2020 213 627.0, filed Oct. 29, 2020, which is hereby incorporated by reference herein in its entirety.

TECHNICAL FIELD

The present disclosure relates to a power module for an inverter in an electric drive in an electric vehicle or hybrid vehicle, a corresponding inverter, and a corresponding electric drive.

BACKGROUND

Electric vehicles and hybrid vehicles are known in the prior art. Purely electric vehicles are powered by one or more electric motors serving as drive mechanisms. In hybrid vehicles, one or more electric motors are used to support the internal combustion engine. To supply the electric motors in these electric vehicles and hybrid vehicles with electricity, the electric and hybrid vehicles comprise power storage units, in particular rechargeable electric batteries with lithium-ion batteries or hydrogen-based fuel cells. These batteries form direct current sources, although electric motors normally run on an alternating current with multiple, typically three, phases. This generates a rotating electromagnetic field in the electric motor, which causes the rotor in the electric motor to rotate through induction.

For this reason, a power electronics with an inverter is normally interconnected between the battery and the electric motor in an electric vehicle or hybrid vehicle. These inverters normally comprise semiconductor switching elements, typically formed by transistors. It is advantageous when the semiconductor switching elements are in different degrees of integration, either as discreet individual switches with a low degree of integration but higher scalability, as power modules with a high degree of integration but lower scalability, or as half-bridges, which range between individual switches and half-bridges with regard to the degree of integration and scalability.

With some electric motors there is a transmission, such as a two-stage transmission, for obtaining a targeted gear transmission ratio. These transmissions are used in particular with powerful electric and hybrid vehicles for obtaining high speeds with a comparatively low rotational rate in the electric motor, thus resulting in a more economical, efficient transfer of force. An additional power electronics is necessary for the transmission, by means of which one or more switching elements are actuated.

With the electric motors known from the prior art that are equipped with a transmission, there is the disadvantage that the power electronics for the electric motor and the power electronics for actuating the transmission require complicated production processes. Furthermore, it is difficult to make these known electric motors compact because of the numerous electronic components. Moreover, it is difficult to adequately seal the chamber for the semiconductor switching elements used in the respective power electronics.

BRIEF DESCRIPTION OF THE DRAWINGS

Certain embodiments shall be explained below by way of example in reference to the embodiments shown in the drawings. Therein.

In general, the same objects, functional units and comparable components have the same reference symbols in all of the drawings.

DETAILED DESCRIPTION

Figure 1:
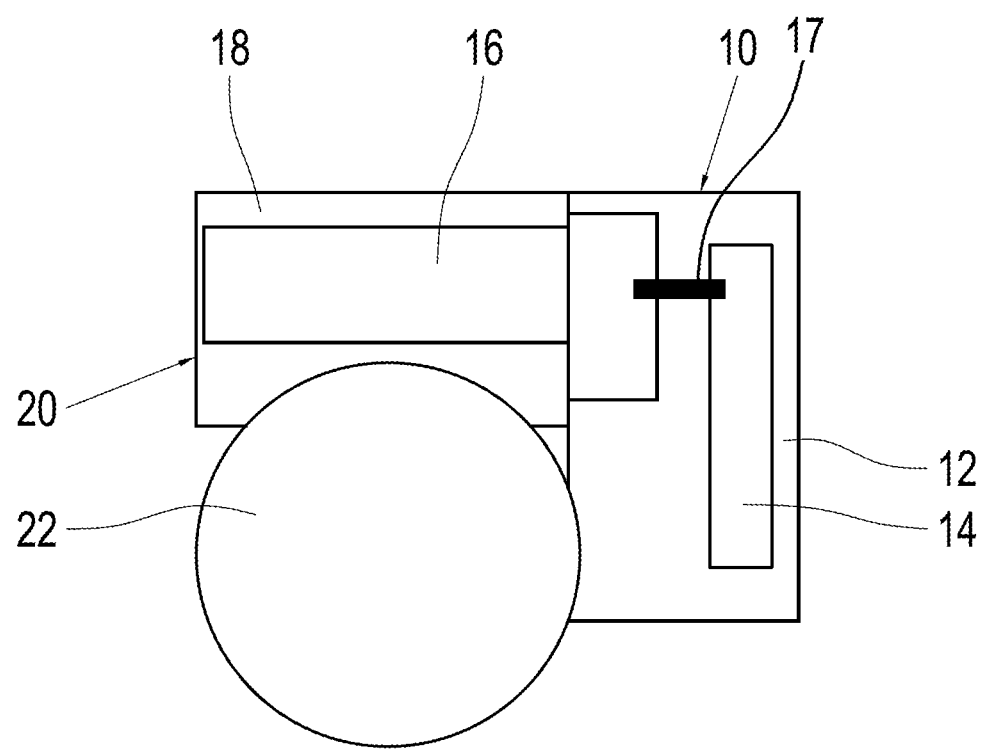
FIG. 1 shows, by way of example and schematically, one possible structure for a power module, in particular for an electric drive in an electric vehicle or a hybrid vehicle.

An object of the present aspects is to create a better inverter for an electric drive in an electric vehicle or hybrid vehicle with regard to the aforementioned disadvantages.

One aspect of the invention relates to a power module for an electric drive in an electric vehicle or hybrid vehicle.

The power module comprises numerous semiconductor switching elements, which are all located on a substrate, and a control unit for the semiconductor switching elements.

The substrate can be a DBC (direct bonded copper) substrate, AMB (active metal brazing) substrate, or IM (insulated metal) substrate. The semiconductor switching elements, in particular transistors and diodes, are placed on the substrate. Alternatively, the semiconductor switching elements can be distributed on numerous substrates. The substrate is preferably rectangular, in particular in the form of a flat, plate-like rectangle with two opposing lateral edges. The substrate can also be square.

The semiconductor switching elements form a half-bridge, preferably at least three half-bridges, each of which is assigned a phase in a multi-phase output current. Each half-bridge comprises a high side and a low side. The high side comprises one or more semiconductor switching elements connected in parallel, to which a comparatively higher electrical potential is applied when the half-bridge is in operation. The low side comprises one or more semiconductor switching elements connected in parallel, to which a comparatively lower electrical potential is applied with the half-bridge is in operation. The high side and low side are connected in series.

The semiconductor switching elements are preferably bipolar transistors with insulated-gate electrodes and/or designed as silicon carbide metal-oxide semiconductor field-effect transistors. Bipolar transistors with insulated-gate electrodes are known in general as IBGTs. Silicon carbide metal-oxide semiconductor field-effect transistors are known in general as SiC MOSFETs. These types of semiconductor switching elements are ideal for low-loss and quick switching, even with high currents.

It is particularly preferred that each bipolar transistor with an insulated gate-electrode is assigned a free-wheeling diode. The free-wheeling diodes protect their bipolar transistors with insulated gate-electrodes from inductive overvoltages, in particular when switching the transistors.

The control unit, which has signal connections connected electrically to the semiconductor switching elements, switches the semiconductor switching elements. Depending on the design of the semiconductor switch, it can be switched on and off by subjecting it to a current or voltage. These semiconductor switching elements are preferably switched through pulse-width modulation (PWM), thus enabling a temporal course of the phases in the form of a sine wave.

According to the invention, the semiconductor switching elements comprise first semiconductor switching elements for providing the electric drive with electricity, and second semiconductor switching elements for a transmission connected to the electric axle drive. The second semiconductor switching elements are preferably designed to provide electricity to an electric motor, by means of which the transmission can be controlled, and/or a pump for generating pressure in a fluid line through which a transmission coolant or lubricant flows. This results in a power module containing not only semiconductor switching elements, which convert an input direct current to an output, multi-phase, alternating current by means of targeted switching, wherein the phases are then conducted to coils in the electric axle drive for the electric or hybrid vehicle. There are also additional semiconductor switching elements in the same power module, which likewise convert a direct current to an alternating current, wherein the phases of the alternating current are conducted into the coils in at least one electric motor for the transmission connected to the electric axle drive. In this manner, a single power module is needed for the electric axle drive in the electric or hybrid vehicle and for the transmission connected to the axle drive, in particular a shifting transmission. This results in a combined or collective power electronics for the electric axle drive and for the transmission, which advantageously results in simpler production and a reduction in the necessary chamber.

According to one embodiment, the control unit shares a printed circuit board with the first and second semiconductor switching elements. As a result, only one printed circuit board is needed for both the first semiconductor switching elements and the second semiconductor switching elements. This simplifies production of the power module.

The first and second semiconductor switching elements preferably face the same side of the shared printed circuit board. As a result, the printed circuit board is populated on only one side, thus simplifying production. Alternatively, the first semiconductor switching elements are placed on a heatsink, preferably beneath the printed circuit board (on the side of the printed circuit board facing away from the lid on the housing), wherein the second semiconductor switching elements are placed on the side of the printed circuit board facing toward the lid on the housing.

There is preferably also a processor for controlling the first and second semiconductor switching elements on this printed circuit board. This results in a power module that requires only one processor for controlling the semiconductor switching elements for the actual electric axle drive, and for controlling the transmission connected thereto. The elimination of other processors results in significant cost reductions as well as a more compact power module. Another advantage of the shared processor is the higher processing speed of the software. In particular, a shared processor is much faster than two processors operated as master and slave.

According to another embodiment, the power module comprises first power connections for electrical contact with the first semiconductor switching elements and second power connections for electrical contact with the second semiconductor switching elements, wherein the first power connections are supplied with a first input current, and the second power connections are supplied with a second input current, and the first power connections are galvanically separated from the second power connections. The first input current is a direct current, for example, which is generated by a DC power source, such as a battery for the electric axle drive. Depending on the vehicle's power, the input voltage can reach up to 400V or 800V, resulting in a correspondingly higher first input current. The second input current is a direct current, for example, which correlates to the on board power supply, with a typical voltage of 12V. Because of the significant difference between the input voltages, and therefore the input currents, it is advantageous from a safety perspective to use galvanically separated power connections for the electrical contact with the various semiconductor switching elements.

Another aspect of the invention is an inverter for an electric drive in an electric vehicle or hybrid vehicle, comprising the power module according to the invention.

According to one embodiment, the inverter comprises a housing in which a hollow chamber is formed for the first semiconductor switching elements, the second semiconductor switching elements, and the control unit. The first and second semiconductor switching elements are therefore located in the same hollow chamber. As a result, it is possible to use the same power electronics for the electric axle drive and for the transmission connected thereto, advantageously resulting is a much smaller chamber than that for prior known products that have separate chambers for the respective power electronics.

The inverter preferably comprises a shared heatsink located in the housing, which is thermally coupled to the first and second semiconductor switching elements. This results in the need for only one heatsink for cooling the semiconductor switching elements, both for the actual electric axle drive and for the transmission connected thereto. The semiconductor switching elements are preferably cooled via the housing. The semiconductor switching elements are preferably cooled via the heatsink. By eliminating further heatsinks, the resulting power module is particularly compact, and the production costs for the inverter can also be reduced.

According to another embodiment, the housing has numerous attachment holes, preferably screw-holes, for securing the inverter to an electric drive and/or a transmission. The inverter and its housing can then function as a cover for the electric axle drive and the transmission. This facilitates a uniform shape of the overall construction, comprised of the inverter and the electric axle drive and/or the transmission. This can also result in a further reduction in the necessary chamber.

The housing preferably has a lid and a body that can be closed by the lid, wherein at least one of the fastening holes is a through hole, which extends from an upper surface of the lid through the space inside the housing, to a lower surface of the body. As a result, by closing the lid on the body, the entire housing can be secured to the electric axle drive and/or transmission, thus forming a cover. This enables a reliable attachment of the inverter to the electric axle drive and/or transmission.

FIG. 1 shows a schematic illustration of one possible construction of a power module 10 according to the invention for an electric axle drive 22 in an electric vehicle or a hybrid vehicle. The power module 10 comprises a housing 12, which has an inner chamber. There is a power electronics 14 in the chamber. The power electronics 14 is showed here in a very simplified illustration and normally comprises numerous semiconductor switching elements, each of which is placed on a substrate. The substrate is on a printed circuit board, on which there is also a control unit for controlling the individual semiconductor switching elements. The semiconductor switching elements comprise first semiconductor switching elements for the electric axle drive 22 in the electric or hybrid vehicle. The semiconductor switching elements also comprise second semiconductor switching elements for a transmission 20 connected to the electric axle drive, for shifting the electric axle drive between at least two gears.

As is shown in a very simplified and schematic illustration in FIG. 1, the transmission 20 comprises a transmission housing 18 with a transmission control unit 16 inside it. The transmission control unit 16 can be controlled by means of the second semiconductor switching elements in the power electronics 14, in particular by targeted switching of the second semiconductor switching elements, in order to actuate the transmission 20.

A shared power electronics 14 for both the actual electric axle drive 22 and the transmission 20 connected to it is therefore shown in FIG. 1. The chamber in which the power electronics 14 is located is a dry chamber, which insulates the semiconductor switching elements from other chambers, in particular those in the transmission 20 or the electric axle drive 22.

Furthermore, signal contacts 17 for controlling valves in the transmission and/or receiving shifting signals for the transmission are shown in a very simplified and purely schematic illustration in FIG. 1. These signal contacts 17 are preferably on a printed circuit board 104 and extend into an oil chamber in the transmission 16. The signal contacts 17 are preferably sealed against oil with a plastic, in particular a thermosetting plastic. As a result, there is no need for signal lines outside the housing for the power electronics, thus resulting in a simpler production process. This also ensures a high reliability of the signal transmission because of the oil-tight seal.

Figure 2:
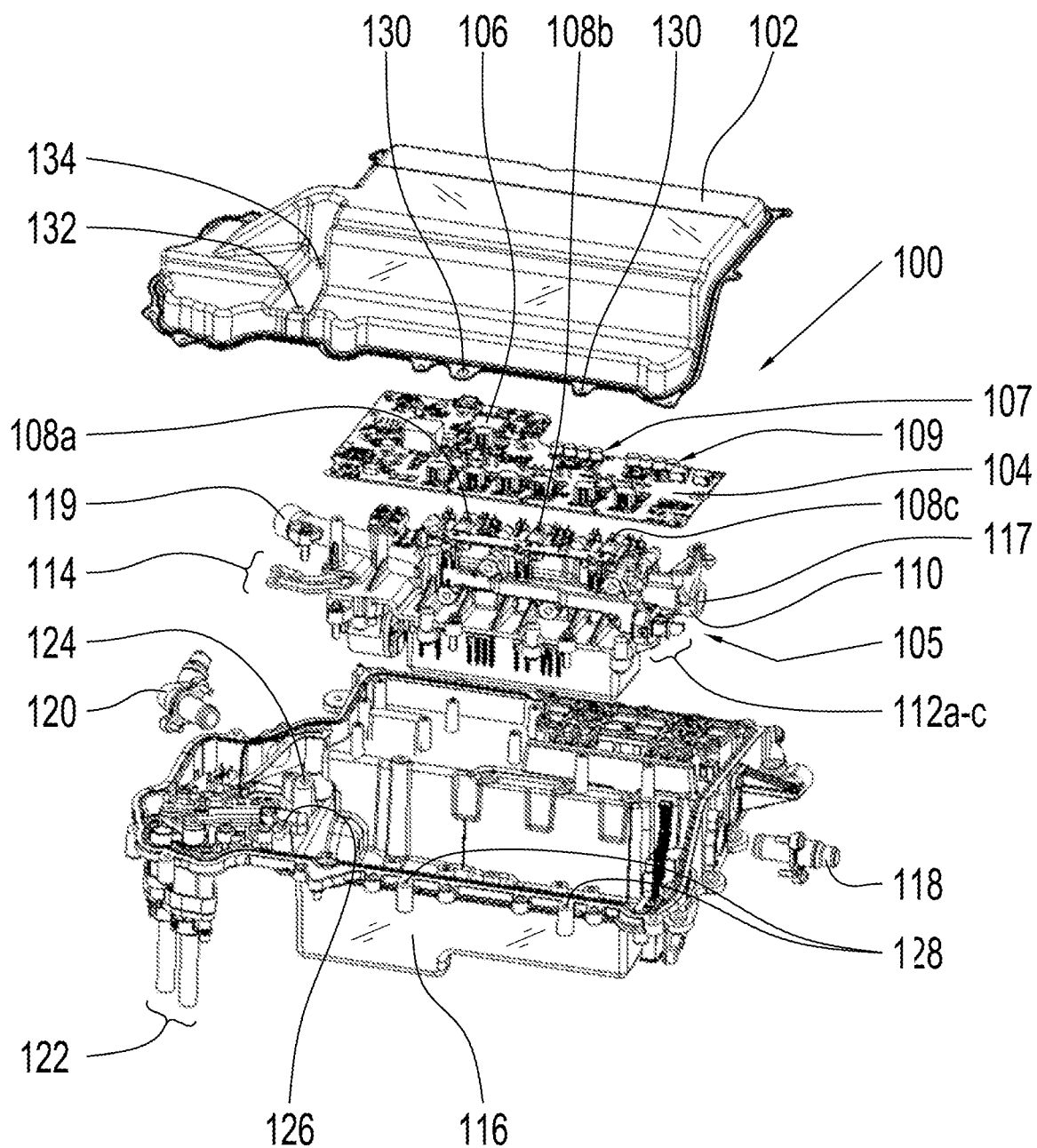
FIG. 2 shows, by way of example and schematically, one possible inverter according to an embodiment, in an exploded view.
Figure 4:
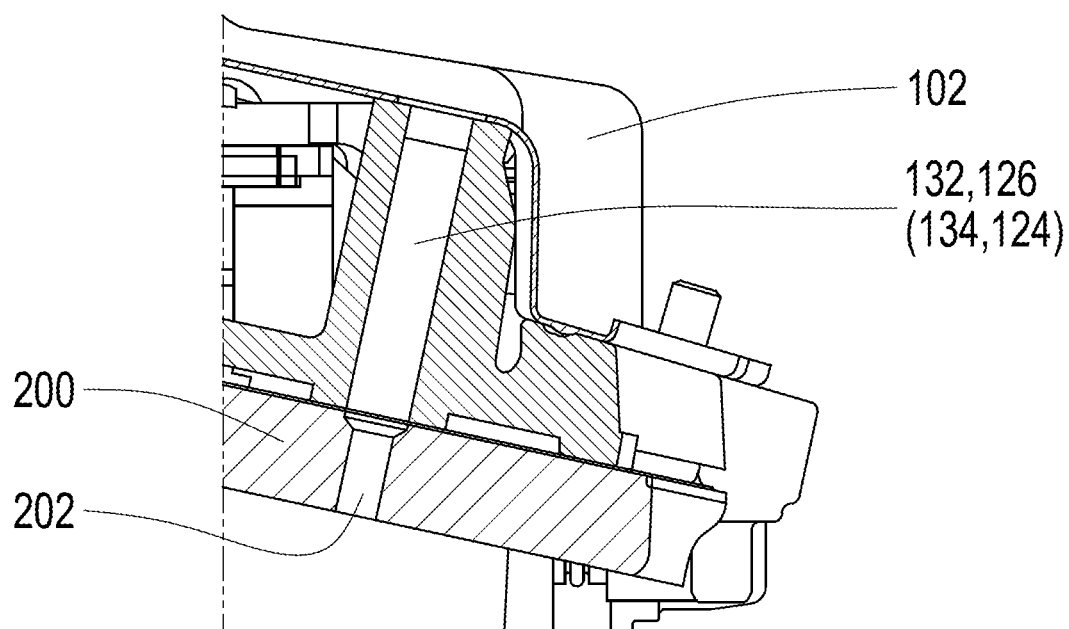
FIG. 4 shows, by way of example and schematically, another section of the inverter shown in FIG. 2, in a cutaway view.

FIG. 2 shows a schematic illustration of one possible inverter 100 according to an embodiment, in an exploded view. The inverter 100 comprises a housing, which has a lid 102 and a body 116. The body 116 can be closed with the lid 102 by means of screws, for which there are numerous holes 124, 126, 128, 130, 132, 134. A sealant is placed on the connection between the lid 102 and the body 116, for sealing the housing against environmental effects, e.g. oils and other contaminants. The entire housing is closed when the body 116 is closed with the lid 102 using the screws, and it can then be closed on a housing for the electric axle drive 22 and/or the transmission 20. FIG. 4 shows more in this regard, and shall be described comprehensively below.

The inverter 100 also comprises a power core 105. The power core 105 comprises a heatsink 110 through which a coolant such as water flows. Numerous coolant channels are formed for this inside the heatsink. A coolant intake 118 and a coolant outlet 120 are located on the body 116, which are connected to the heatsink 110 by two associated openings 117, 119.

The inverter 100 also comprises a control unit that has a printed circuit board 104. Numerous first semiconductor switching elements 108*a*, 108*b*, 108*c* are placed on a side of the power core 105 facing the printed circuit board 104, which are intended for operating the electric axle drive 22. Numerous sockets are formed on a side of the printed circuit board 104 facing the power core 105, into which numerous contact elements on the upper surfaces of the first semiconductor switching elements 108*a*, 108*b*, 108*c* can be plugged in order to secure the first semiconductor switching elements 108*a*, 108*b*, 108*c* on the printed circuit board 105. The first semiconductor switching elements 108*a*-*c* are each attached to a substrate (a direct bonding copper, DCB substrate), which in turn is attached to the heatsink 110 in order to obtain a thermal coupling between the first semiconductor switching elements 108*a*-*c* and the heatsink 110. The first semiconductor switching elements are preferably divided into three groups: a first group 108*a* of semiconductor switching elements generates a first phase in a multi-phase output current (alternating current), a second group 108*b* of semiconductor switching elements generates a second phase in the multi-phase output current, and a third group 108*c* of semiconductor switching elements generates a third phase of the multi-phase output current.

Numerous second semiconductor switching elements 107, 109 are also attached to the side of the printed circuit board 104 facing the power core 105. The second semiconductor switching elements 107, 109 are intended for the transmission 20 connected to the electric axle drive 22, and comprise, by way of example, a first group 107 for controlling the transmission, in particular for actuating a switch in the transmission 20, and a second group 109 for use with an oil pump for cooling the transmission 20. The first group 107 and second group 109 are each connected to an associated electric motor (in particular an associated electric motor), in order to actuate the switches or control the oil pump by supplying the electric motor with electricity. This is therefore a shared printed circuit board 104, populated with both the first semiconductor switching elements 108*a*-*c* and the second semiconductor switching elements 107, 109.

On a side facing the lid 102, the printed circuit board 104 is populated with numerous electronic components, comprising in this case numerous driver components electrically connected to the first and second semiconductor switching elements 108*a*-*c*, 107, 109, and numerous intermediate circuit capacitors, each of which forms a commutation circuit to the respective half-bridges from the semiconductor switching elements. There is also a processor 106 on the printed circuit board 104 which is electrically connected to both the first semiconductor switching elements 108*a*-*c* and the second semiconductor switching elements 107, 109 via the driver components. This is therefore a collective processor 106 for controlling both the first semiconductor switching elements 108*a*-*c* and thus the electric axle drive 22 for the electric or hybrid vehicle, and the second semiconductor switching elements 107, 109, and therefore the transmission 20.

There are numerous power connections 112*a*-*c*, 114 on the power core 105 that can be attached to the contact points intended for them in the body 116. The power connections 112*a*-*c*, 114 include two DC power connections 114 comprising a positive DC power connection for contact with a positive connection in a DC input 122, and a negative DC power connection for contact with a negative connection in the DC input in the inverter 100. There are also numerous AC power connections 112*a*-*c* on the power core 105 that each output a respective phase in a multi-phase output current (alternating current) to the electric axle drive 22. The AC power connections 112*a*-*c* are located here, by way of example, on an end of the power core 105 facing away from the DC power connections 114.

Figure 3:
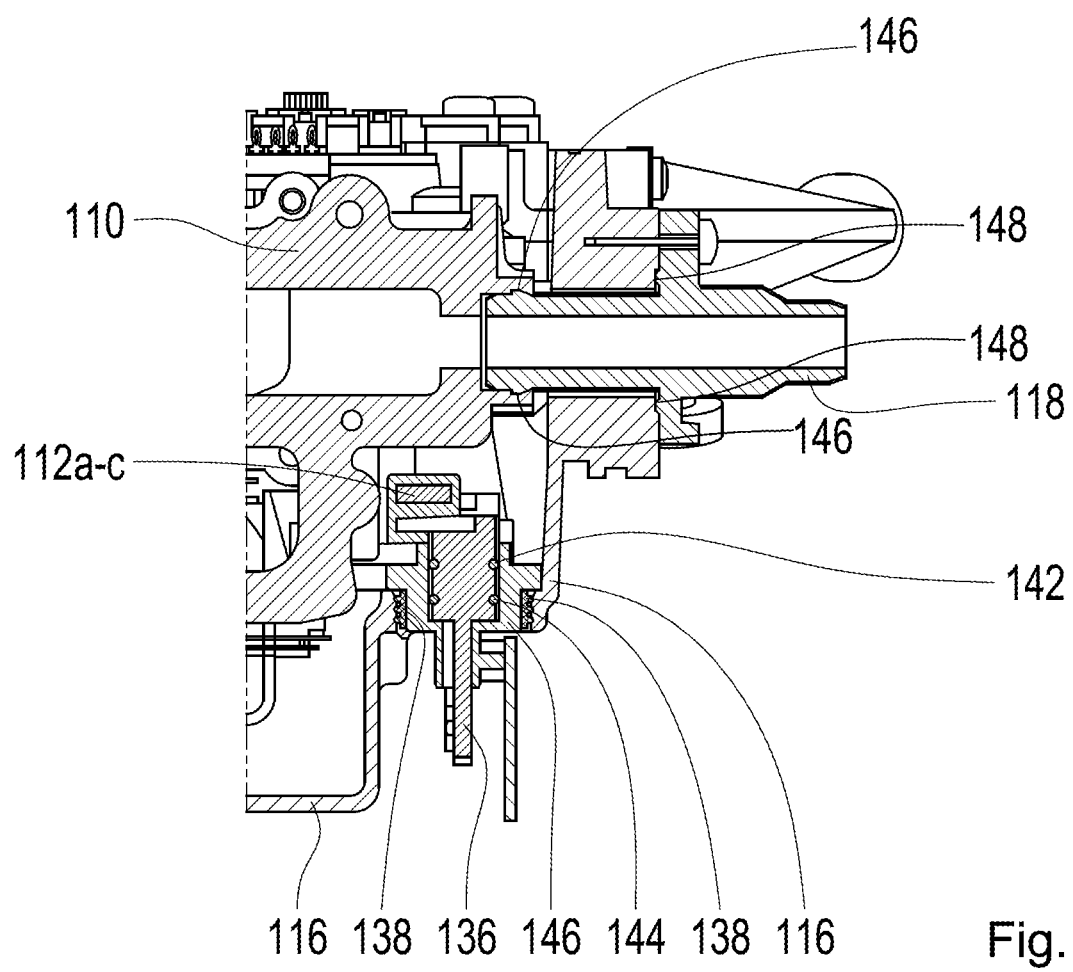
FIG. 3 shows, by way of example and schematically, a section of the inverter shown in FIG. 2, in a cutaway view.

FIG. 3 shows a schematic illustration of a section of the inverter 100 shown in FIG. 2, in a cutaway view. This shows, in particular, a sealing attachment of a busbar 136, which is electrically connected to an AC power connection 112a-c, in order to provide the associated phases to coils in the electric axle drive 22. The sealing attachment is formed by two first sealing rings 142, 144, located between the top of the busbar 136 and an insulating plate 146 for electrically insulating the busbar 136. The insulating plate 146 is then laterally sealed against the body 116 of the housing by means of a second sealing ring 138. The second sealing ring 138 is a multi-lipped seal, for example, which engages radially in the housing in a force-fitting manner, and preferably also in a form-fitting manner. The inner wall of the housing is preferably smooth where this engagement takes place.

As is also shown in FIG. 3, the coolant intake 118 and coolant outlet 120 are sealed by means of a radial seal 147 against the housing, and also against the heatsink 110 by means of an axial seal 148. The sealing surface of the radial seal 147 is circumferential. The normal shape of the sealing surface in the axial seal points in the axial direction. This ensures a sealing of the coolant against any contaminants from the interior of the power module, as well as contaminants from the chamber for the electric motor and the transmission (through liquid lubricants for the transmission, for example).

FIG. 4 shows a schematic illustration of another section of the inverter 100 shown in FIG. 2, in a cutaway view. This shows, in particular, a through hole for a screw connection between the housing (comprising 102, 116) for the inverter 100, and a housing 200 for the electric axle drive 22 and/or the transmission 20. The through hole comprises a first section, composed of pairs of through holes 132, 126, (or 134 and 124), and a second section 202, which is formed in a housing 200 for the electric axle drive 22 and/or transmission 20, and coaxial to the first section. The pairs of through holes 132 and 126 (or 134 and 124) are also composed of two coaxial through holes. As a result, the entire housing (comprising 102, 116) for the inverter is closed when the body 116 is closed with the lid 102 by means of the screw connections, and can then be closed on the housing 200 for the electric axle drive 22 and/or the transmission 20.

REFERENCE SYMBOLS 10 power module
12 housing
14 power electronics
16 transmission control unit
18 housing
20 transmission
22 electric axle drive
100 inverter
102 lid
104 printed circuit board
105 power core
106 processor
107 first group of second semiconductor switching elements
108a-c first semiconductor switching elements
109 second group of second semiconductor switching elements
110 heatsink
112a-c AC power connections
114 DC power connections
116 body
118 coolant intake
120 coolant outlet
122 DC input
124, 126, 128, 130, 132, 134 through holes
136 busbar
138 second sealing ring
142, 144 first sealing ring
200 housing
202 through hole

We claim:

1. A power module for an electric axle drive, comprising:
a plurality of semiconductor switching elements, wherein the semiconductor switching elements are attached to a substrate; and
a control unit electrically connected to the plurality of semiconductor switching elements,
wherein the plurality of semiconductor switching elements comprises:
a first set of semiconductor switching elements dedicated to the electric axle drive; and
a second set of second set of semiconductor switching elements dedicated to a transmission connected to the electric axle drive;
wherein the control unit has a common printed circuit board; and
wherein the first set of semiconductor switching elements and the second set of semiconductor switching elements are located on the common printed circuit board.

2. The power module according to claim 1, wherein the first set of semiconductor switching elements and the second set of semiconductor switching elements face the same side of the common printed circuit board.

3. The power module according to claim 1, wherein a processor for controlling both the first set of semiconductor switching elements and the second set of semiconductor switching elements is located on a common printed circuit board.

4. The power module according to claim 1,
further comprising a first set of power connections for obtaining electrical contact with the first set of semiconductor switching elements and a second set of power connections for obtaining electrical contact with the second set of semiconductor switching elements,
wherein the first set of power connections are subjected to a first input current,
wherein the second set of power connections are subjected to a second input current that is lower than the first input current, and
wherein the first set of power connections are galvanically separated from the second set of power connections.

5. The power module according to claim 1, wherein the second set of semiconductor switching elements are configured to provide electricity to an electric motor for actuating the transmission.

6. The power module according to claim 1, wherein the second set of semiconductor switching elements are configured to provide electricity to a pump for generating pressure in a fluid line through which a transmission coolant and/or lubricant flows.

7. The power module according to claim 1, further comprising signal contacts on the printed circuit board for controlling transmission valves, wherein the signal contacts extend into an oil chamber, and wherein the signal contacts are sealed in an oil-tight manner with a thermosetting plastic.

8. The power module according to claim 1, further comprising signal contacts on the printed circuit board for receiving switching signals for the transmission, wherein the signal contacts extend into an oil chamber, and wherein the signal contacts are sealed in an oil-tight manner with a thermosetting plastic.

9. An inverter for an electric axle drive in an electric vehicle or hybrid vehicle, comprising:
a power module having a plurality of semiconductor switching elements, wherein the semiconductor switching elements are attached to a substrate,
wherein the power module includes a control unit electrically connected to the plurality of semiconductor switching elements,
wherein the plurality of semiconductor switching elements comprises:
a first set of semiconductor switching elements dedicated to the electric axle drive; and
a second set of second set of semiconductor switching elements dedicated to a transmission connected to the electric axle drive, wherein the second set of semiconductor switching elements provide electricity to the transmission for changing gears.

10. The inverter according to claim 9, further comprising a housing forming a chamber for receiving the first set of semiconductor switching elements, the second set of semiconductor switching elements, and the control unit.

11. The inverter according to claim 10, further comprising a heatsink located in the chamber, the heatsink being thermally coupled to the first set of semiconductor switching elements.

12. The inverter according to claim 11, wherein the second set of semiconductor switching elements are thermally coupled to the housing such that the housing cools the second set of semiconductor switching elements.

13. The inverter according to claim 12, wherein the heatsink is integral with the housing such that the first set of semiconductor switching elements are also cooled by the housing.

14. The inverter according to claim 10, further comprising a heatsink located in the housing, the heatsink being thermally coupled to the first set of semiconductor switching elements and the second set of semiconductor switching elements.

15. The inverter according claim 10, wherein the housing includes a plurality of fastening holes for securing the inverter on the electric axle drive and/or a transmission.

16. The inverter according to claim 15, wherein the housing includes a lid and a body that is closable with the lid, wherein at least one fastening hole is a through hole extending from an upper surface of the lid, through an internal chamber in the housing, to a lower surface of the body.

17. The inverter according to claim 9, wherein a coolant intake and/or coolant outlet are sealed against the housing with a radial sealing ring and against a heatsink with an axial sealing ring.

18. The power module according to claim 9, wherein the second set of semiconductor switching elements are further configured to also provide electricity to a pump for generating pressure in a fluid line through which a transmission coolant and/or lubricant flows.

19. The power module according to claim 9, wherein the control unit has a common printed circuit board, and wherein the first set of semiconductor switching elements and the second set of semiconductor switching elements are located on the common printed circuit board.

20. The power module according to claim 19, further comprising signal contacts on the printed circuit board for receiving switching signals for the transmission, wherein the signal contacts extend into an oil chamber, and wherein the signal contacts are sealed in an oil-tight manner with a thermosetting plastic.

* * * * *